(12) United States Patent
MacMillan

(10) Patent No.: US 9,613,810 B2
(45) Date of Patent: Apr. 4, 2017

(54) SILICON CARBIDE SEMICONDUCTOR DEVICES HAVING NITROGEN-DOPED INTERFACE

(71) Applicant: Global Power Technologies Group, Inc., Lake Forest, CA (US)

(72) Inventor: Michael MacMillan, Rancho Santa Margarita, CA (US)

(73) Assignee: Global Power Technologies Group, Inc., Lake Forest, CA (US)

(*) Notice: Subject to any disclaimer, the term of this patent is extended or adjusted under 35 U.S.C. 154(b) by 0 days.

(21) Appl. No.: 15/295,968

(22) Filed: Oct. 17, 2016

(65) Prior Publication Data

US 2017/0032965 A1    Feb. 2, 2017

Related U.S. Application Data

(62) Division of application No. 14/133,507, filed on Dec. 18, 2013.

(60) Provisional application No. 61/738,943, filed on Dec. 18, 2012.

(51) Int. Cl.

| H01L 29/24 | (2006.01) |
|---|---|
| H01L 29/51 | (2006.01) |
| H01L 29/739 | (2006.01) |
| H01L 29/78 | (2006.01) |
| H01L 29/161 | (2006.01) |
| H01L 21/20 | (2006.01) |
| H01L 21/04 | (2006.01) |
| H01L 21/02 | (2006.01) |

(Continued)

(52) U.S. Cl.
CPC ...... *H01L 21/049* (2013.01); *H01L 21/02164* (2013.01); *H01L 21/02236* (2013.01); *H01L 21/02255* (2013.01); *H01L 21/02304* (2013.01); *H01L 21/02529* (2013.01); *H01L 21/02576* (2013.01); *H01L 21/045* (2013.01); *H01L 29/1608* (2013.01); *H01L 29/513* (2013.01); *H01L 29/518* (2013.01); *H01L 29/66068* (2013.01); *H01L 29/7827* (2013.01)

(58) Field of Classification Search
CPC ..... H01L 29/36; H01L 29/1608; H01L 29/45; H01L 29/518; H01L 29/7395
USPC .......................... 257/77, 287; 438/268, 478
See application file for complete search history.

(56) References Cited

U.S. PATENT DOCUMENTS

| 2006/0220026 A1 | 10/2006 | Uchida et al. |
| 2010/0230745 A1 | 9/2010 | Saito et al. |
| 2011/0180813 A1 | 7/2011 | Harada et al. |

(Continued)

OTHER PUBLICATIONS

Radtke et al., Initial stages of SiC oxidation investigated by ion scattering and angle-resolved x-ray photoelectron spectroscopies, Appl. Phy. Lett., 78(23):3601-3603, 2001.

*Primary Examiner* — Kimberly Rizkallah
*Assistant Examiner* — Brian Turner
(74) *Attorney, Agent, or Firm* — Perkins Coie LLP

(57) ABSTRACT

Methods, systems, and devices are disclosed for implementing high power circuits and semiconductor devices. In one aspect, a method for fabricating a silicon carbide semiconductor device includes forming a thin epitaxial layer of a nitrogen doped SiC material on a SiC epitaxial layer formed on a SiC substrate, and thermally growing an oxide layer to form an insulator material on the nitrogen doped SiC epitaxial layer, in which the thermally grown oxide layer results in at least partially consuming the nitrogen doped SiC epitaxial layer in the oxide layer to produce an interface including nitrogen between the SiC epitaxial layer and the oxide layer.

17 Claims, 5 Drawing Sheets

(51) Int. Cl.
*H01L 29/16* (2006.01)
*H01L 29/66* (2006.01)

(56) References Cited

U.S. PATENT DOCUMENTS

2012/0139623 A1 6/2012 Hashimoto et al.
2012/0235165 A1 9/2012 Harada et al.

SILICON CARBIDE SEMICONDUCTOR DEVICES HAVING NITROGEN-DOPED INTERFACE

CROSS REFERENCE TO RELATED APPLICATIONS

This patent document is a divisional of U.S. patent application Ser. No. 14/133,507, published as US 2014/0167073, entitled "SILICON CARBIDE SEMICONDUCTOR DEVICES HAVING NITROGEN-DOPED INTERFACE", and filed on Dec. 18, 2013, which further claims the benefit of U.S. Provisional Patent Application No. 61/738,943, filed on Dec. 18, 2012, entitled "SILICON CARBIDE SEMICONDUCTOR DEVICES HAVING NITROGEN-DOPED INTERFACE." The entire content of the before-mentioned patent applications is incorporated by reference as part of the disclosure of this document.

TECHNICAL FIELD

This patent document relates to semiconductor technologies.

BACKGROUND

Silicon carbide (SiC) semiconductor materials can exist of various crystalline forms and can be used to construct various SiC based circuits and devices. In comparison with the commonly used silicon, SiC materials possess properties such as a wide bandgap structure and higher breakdown field. These properties make SiC materials attractive for a wide range of circuits and applications including high power electronics.

A field-effect transistor (FET) is a transistor that uses an electric field to control the shape and in turn the conductivity of a channel of one type of charge carrier in a semiconductor material. FETs are unipolar transistors that involve single-carrier-type operation. FETs can be structured to include an active channel through which majority charge carriers, e.g., such as electrons or holes, flow from a source to a drain. The main terminals of a FET include a source, through which the majority carriers enter the channel; a drain, through which the majority carriers leave the channel; and a gate, the terminal that modulates the channel conductivity. For example, source and drain terminal conductors can be connected to the semiconductor through ohmic contacts. The channel conductivity is a function of the potential applied across the gate and source terminals.

SUMMARY

Techniques, systems, and devices are disclosed for implementing high power circuits and semiconductor devices on SiC materials with nitrogen incorporated at a $SiO_2$/SiC interface through epitaxial growth of a highly nitrogen doped top epitaxial layer.

In one aspect of the disclosed technology, a method for fabricating a silicon carbide semiconductor device includes forming a thin epitaxial layer of a nitrogen doped SiC material on a SiC epitaxial layer formed on a SiC substrate, and thermally growing an oxide layer to form an insulator material on the nitrogen doped SiC epitaxial layer, in which the thermally growing the oxide layer results in at least partially consuming the nitrogen doped SiC epitaxial layer in the oxide layer to produce an interface including nitrogen between the SiC epitaxial layer and the oxide layer.

In another aspect, a SiC device is disclosed to include a SiC substrate; a SiC epitaxial layer formed on the SiC substrate; an oxide layer of an insulator material formed on the SiC epitaxial layer, the oxide layer including a surface layer including nitrogen that forms an interface with the SiC epitaxial layer; and one or more transistor structures over the oxide layer.

In another aspect, a SiC device is disclosed to include a SiC substrate; a SiC epitaxial layer formed on the SiC substrate; an oxide layer of an insulator material formed on the SiC epitaxial layer, the oxide layer including a surface layer including nitrogen that forms an interface with the SiC epitaxial layer; a residual layer formed of a nitrogen doped SiC epitaxial layer between the SiC epitaxial layer and the surface layer of the oxide layer; and one or more transistor structures over the oxide layer.

In another aspect, a method is provided for forming a transistor over a SiC substrate and includes forming a SiC epitaxial layer over a SiC substrate; forming a source region and a gate region over the SiC epitaxial layer; forming a thin epitaxial layer of a nitrogen doped SiC material on over the gate region over the SiC epitaxial layer; growing an oxide layer to form an insulator material on the nitrogen doped SiC epitaxial layer to form an interface that includes nitrogen between the SiC epitaxial layer and the oxide layer without performing post oxidation gas annealing; and forming a source conductive contact over the source region and a gate conductive contact over the gate region as part of a transistor.

In yet another aspect, a method for fabricating a silicon carbide (SiC) device is disclosed to include forming a thin epitaxial layer of a nitrogen doped SiC material on a SiC epitaxial layer formed on a SiC substrate; thermally growing an oxide layer to form an insulator material on the nitrogen doped SiC epitaxial layer; and controlling the thermally growing the oxide layer to cause the nitrogen doped SiC epitaxial layer in the oxide layer to be at least partially consumed to produce an interface including nitrogen between the SiC epitaxial layer and the oxide layer.

Those and other aspects, implementations and associated features are described in greater in detail in the drawings, the description and claims.

BRIEF DESCRIPTION OF THE DRAWINGS

Like reference symbols and designations in the various drawings indicate like elements.

DETAILED DESCRIPTION

Techniques, systems, and devices are disclosed for implementing high power circuits and semiconductor devices based on SiC materials with nitrogen incorporated at a $SiO_2$/SiC interface through epitaxial growth of a highly nitrogen doped top epitaxial layer.

Silicon carbide can be used as a semiconductor material for fabricating power electronic devices, e.g., such as field effect transistors used in power control applications, including high power circuits. Fabrication of such field effect transistors can include creating an insulator on a silicon carbide (SiC) substrate. For example, in the case of a silicon dioxide ($SiO_2$) insulator material on the SiC substrate, a disturbed interface exists between the $SiO_2$ and the SiC due to the changed surface stoichiometry, which can result in a surface roughness that have negative effects on the performance of the device. For example, a layer of $SiO_2$ insulator material can be grown on the SiC material at high temperature (e.g., within a range 900° C. to 1200° C.) in an oxidizing environment, e.g., including, but not limited to, dry oxygen, wet oxygen, steam, nitrous oxide ($N_2O$), nitric oxide (NO), among other oxygenated environments. For example, such a process of creating an insulator like $SiO_2$ can often lead to a complex interface and a non-stoichiometric surface of SiC, e.g., which can result in low carrier mobility at the $SiO_2$/SiC interface.

Figure 1:
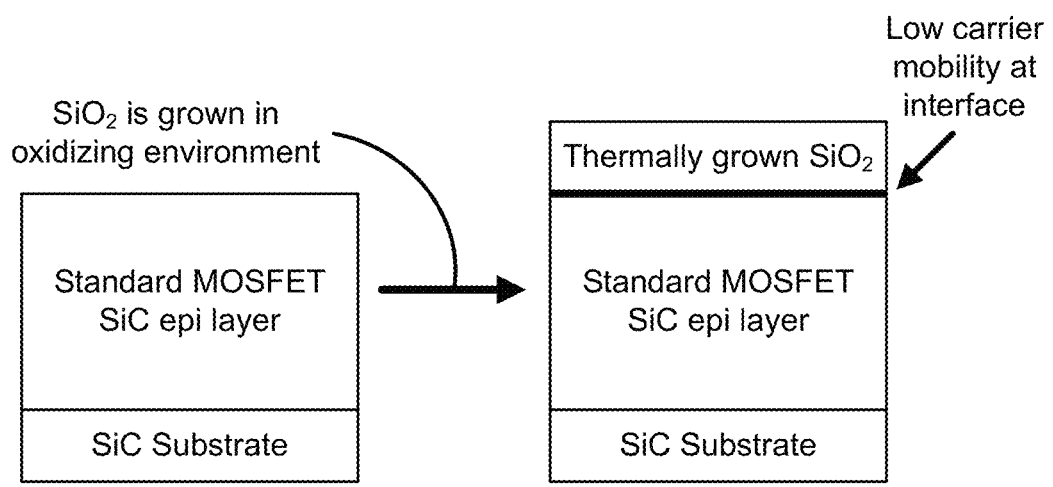
FIG. 1 shows a processing diagram of a device including a silicon dioxide layer grown on a silicon carbide substrate.

FIG. 1 shows a processing diagram of a device including a $SiO_2$ layer grown on a SiC substrate, in which the interface between the $SiO_2$ layer and the SiC substrate forms a disturbed layer (e.g., having a non-stoichiometry and increased roughness). The performance of an exemplary field effect transistor is very sensitive to the quality of the of the $SiO_2$/SiC interface.

For example, a disturbed/rough interface formed between the SiC and a silicon oxide/insulator layer can give rise to a number of undesired results, including: (1) spatial variations that randomly change from one location to another on the interface, which can change electrical properties (e.g., carrier mobility or electrical resistance) from one location to another and create random variations from one device (e.g., such as a FET) to another device formed on the substrate; and (2) increase the resistance and thus decrease carrier mobility in the device. This can significantly degrade the device performance.

Figure 2:
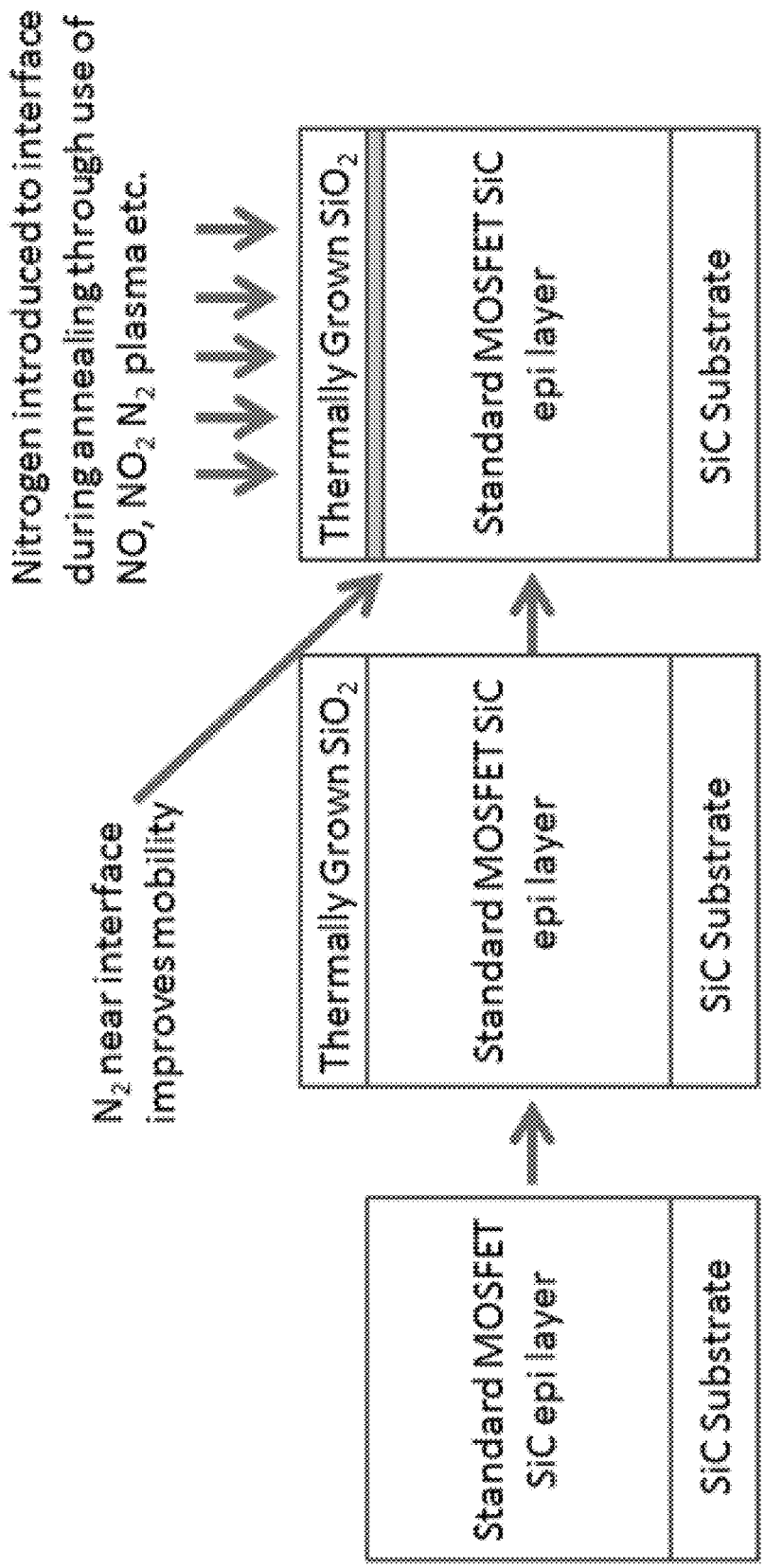
FIG. 2 shows a processing diagram of a device in which nitrogen is introduced at the interface between silicon carbide and a silicon dioxide insulator layer.

FIG. 2 shows a processing diagram of a metal oxide semiconductor field effect transistor (MOSFET) device including a thermally grown $SiO_2$ insulator layer on a SiC epi layer/SiC substrate in which nitrogen is introduced (e.g., by annealing in a nitrogen environment) to interface between the silicon carbide epitaxial layer and outer silicon dioxide insulator layer. For example, annealing the MOSFET device in a $N_2$, NO or $N_2O$ environment can passivate the interface defect and thus improve the quality of the $SiO_2$/SiC interface.

The disclosed technology includes a method to incorporate nitrogen at the $SiO_2$/SiC interface through epitaxial growth of a highly nitrogen doped top epitaxial layer. Such an incorporation of nitrogen at the $SiO_2$/SiC interface through growth of a nitrogen doped SiC epitaxial layer can avoid the aforementioned issues associated with the rough interface and do so without the need for post oxidation annealing.

In one aspect, a method for fabricating a silicon carbide semiconductor device includes forming a thin epitaxial layer of a nitrogen doped SiC material on a SiC epitaxial layer formed on a SiC substrate, and thermally growing an oxide layer to form an insulator material on the nitrogen doped SiC epitaxial layer, in which the thermally growing the oxide layer results in at least partially consuming the nitrogen doped SiC epitaxial layer in the oxide layer to produce an interface including nitrogen between the SiC epitaxial layer and the oxide layer.

In some implementations, the insulator material includes silicon oxide. For example, the oxide layer can be grown at a high temperature within a range 900° C. to 1200° C. in an oxidizing environment. For example, the nitrogen doped SiC epitaxial layer can be formed to have a thickness less than 500 nm. For example, the nitrogen doped SiC material can be configured to have a carrier concentration greater than $1\times10^{18}$ $cm^{-3}$. In some implementations, the method can further include forming one or more transistor structures over the insulator material.

Figure 3:
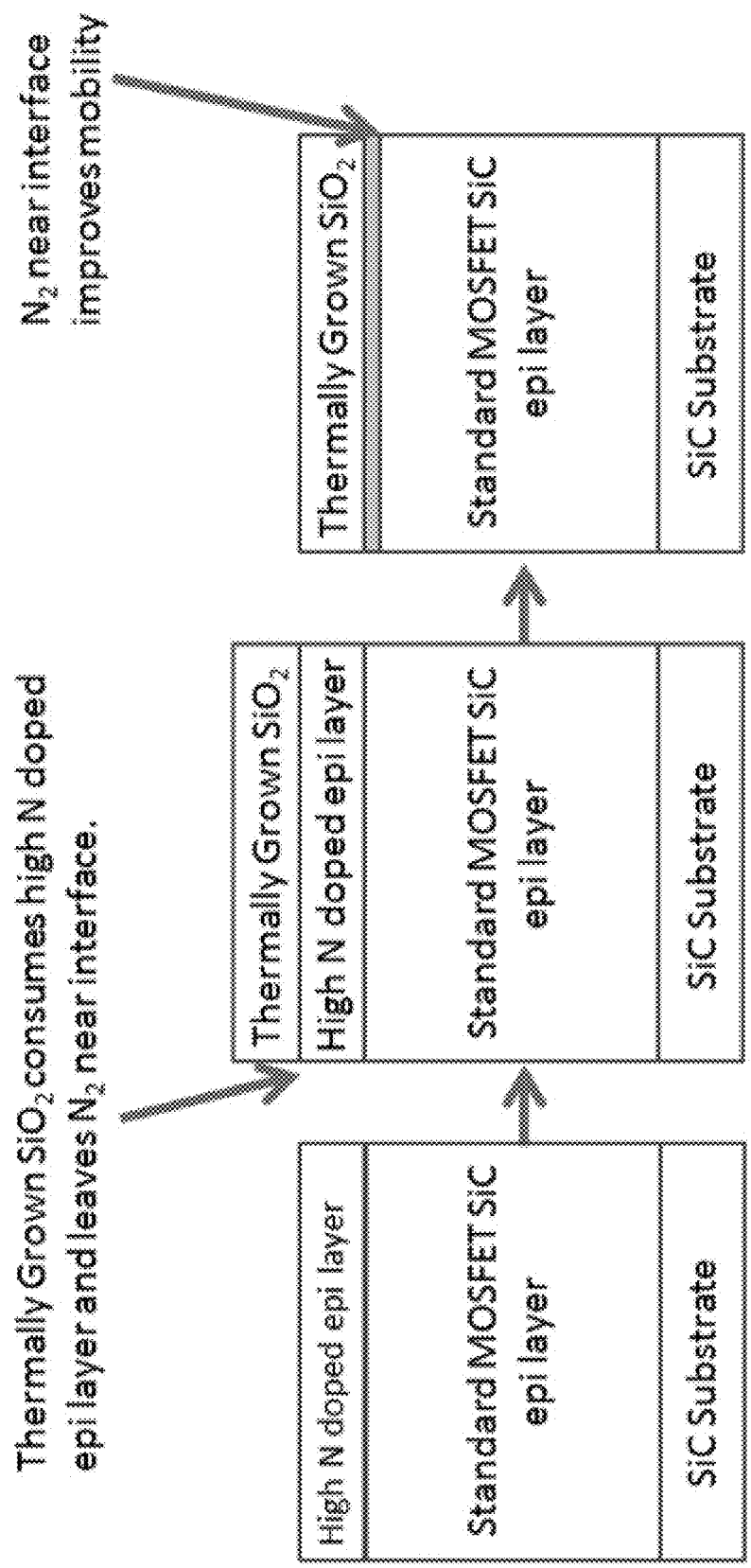
FIG. 3 shows a processing diagram of a method to fabricate a silicon carbide semiconductor device.

For example, the thin epitaxial layer of high nitrogen doped SiC (e.g., >$1\times10^{18}$ $cm^{-3}$) can form a top layer of the field effect transistor's epitaxial stack. For example, standard oxidation of the epitaxial structure will consume at least part of the top most SiC surface (e.g., the heavily nitrogen doped SiC layer) to produce the insulator layer (e.g., $SiO_2$ layer), and this will effectively incorporate nitrogen into the interface, as shown in FIG. 3. FIG. 3 shows a processing diagram of the method to fabricate a SiC semiconductor device including a high N-doped SiC epi layer formed on a silicon carbide substrate and having an nitrogen-containing interface between the SiC epi layer and an outer silicon dioxide insulator layer.

Figure 4:
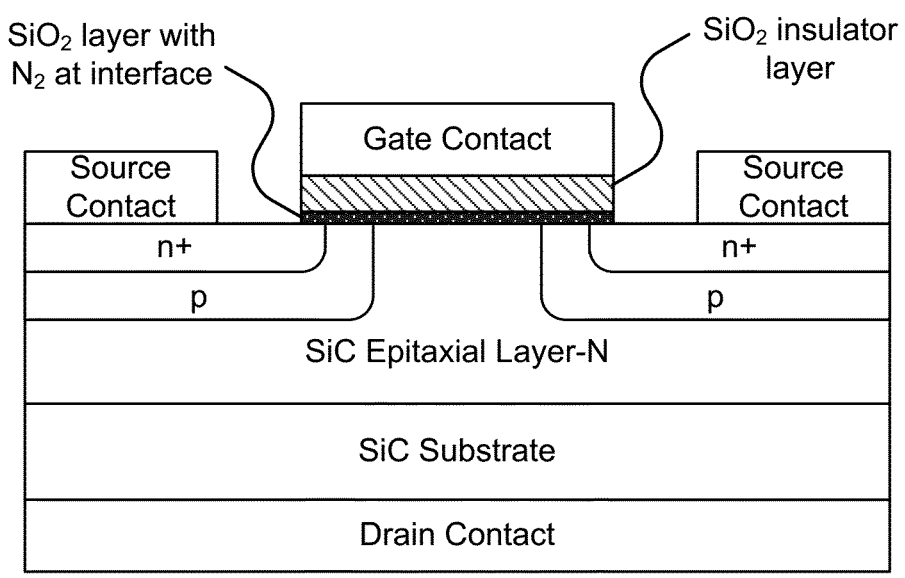
FIG. 4 shows a schematic of an exemplary silicon carbide metal insulator semiconductor field effect transistor device.

Implementations of the fabrication method can produce FET devices with improved performance of structures. FIG. 4 shows a schematic of an exemplary silicon carbide metal insulator semiconductor field effect transistor (MISFET) device that includes an interface including nitrogen between the $SiO_2$ insulator layer and the SiC Epitaxial layer over a SiC substrate.

The device can include a base structure including a SiC substrate configured between a drain contact (e.g., drain electrode) and an SiC epitaxial layer-N. A region of the SiC epitaxial layer-N can be configured to provide a contact surface at the top of the base structure that interfaces with the exemplary insulator layer, e.g., such as silicon dioxide. The insulator layer is formed of an oxide layer on the SiC epitaxial layer-N, in which the exemplary insulator layer includes a interfacial surface that includes nitrogen. The interfacial surface including nitrogen is formed from a thin epitaxial layer of a nitrogen doped SiC material initially formed on the SiC epitaxial layer that is at least partially consumed into the insulator layer during formation (e.g., thermal growth) of the oxide layer. The SiC MISFET device can include a gate contact configured above the insulator layer. The SiC MISFET device can include an n+ layer formed on a p-type well region formed on the SiC epitaxial layer-N. The SiC MISFET device can include source contacts that interface with the n+ layer of the SiC MISFET device.

In some examples of the device, the SiC device can include a SiC substrate, a SiC epitaxial layer formed on the SiC substrate, an oxide layer of an insulator material formed on the SiC epitaxial layer, in which the oxide layer includes a surface layer including nitrogen that forms an interface with the SiC epitaxial layer, and one or more transistor structures over the oxide layer.

Figure 5:
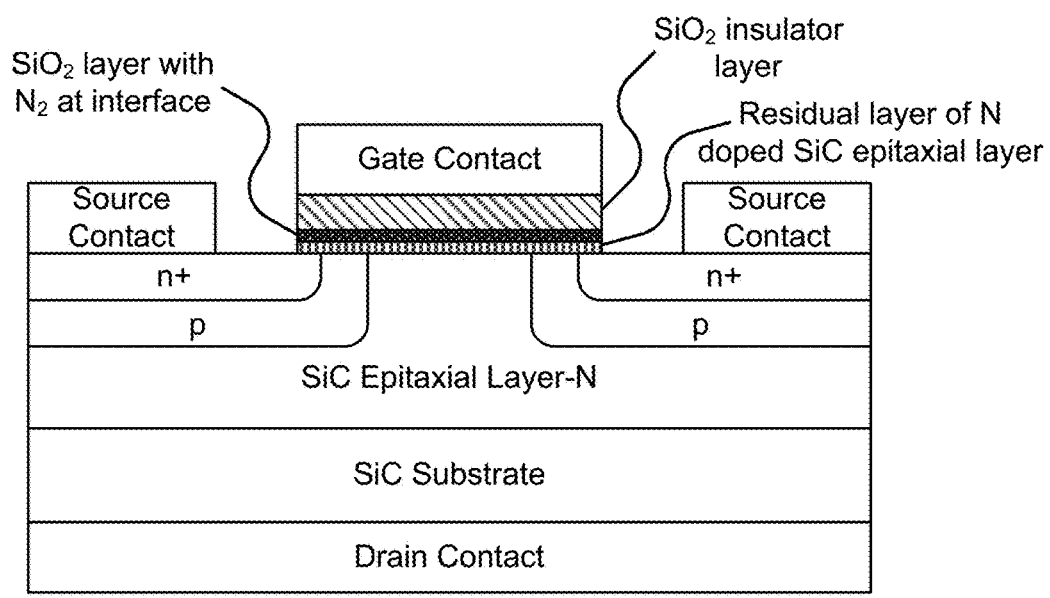
FIG. 5 shows a schematic of an exemplary silicon carbide metal insulator semiconductor field effect transistor device.

In another example of the fabricated FET devices, a SiC device includes a SiC substrate, a SiC epitaxial layer formed on the SiC substrate, an oxide layer of an insulator material formed on the SiC epitaxial layer, in which the oxide layer includes a surface layer including nitrogen that forms an interface with the SiC epitaxial layer, a residual layer formed of a nitrogen doped SiC epitaxial layer between the SiC epitaxial layer and the surface layer of the oxide layer, and one or more transistor structures over the oxide layer. Such an example is shown in FIG. 5.

In some aspects of the disclosed technology, a method for forming a transistor over a SiC substrate includes a process to form a SiC epitaxial layer over a SiC substrate, a process to form a source region and a gate region over the SiC epitaxial layer, a process to form a thin epitaxial layer of a nitrogen doped SiC material on over the gate region over the SiC epitaxial layer, a process to grow an oxide layer to form an insulator material on the nitrogen doped SiC epitaxial layer to form an interface that includes nitrogen between the SiC epitaxial layer and the oxide layer without performing post oxidation gas annealing, e.g., nitidation, annealing in NO, and a process to form a source conductive contact over the source region and a gate conductive contact over the gate region as part of a transistor.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for fabricating a silicon carbide (SiC) device, comprising:
    forming a thin epitaxial layer of a nitrogen doped SiC material on a SiC epitaxial layer formed on a SiC substrate; and
    thermally growing an oxide layer to form an insulator material on the nitrogen doped SiC epitaxial layer,
    wherein the thermally growing the oxide layer results in at least partially consuming the nitrogen doped SiC epitaxial layer in the oxide layer to produce an interface including nitrogen between the nitrogen doped SiC epitaxial layer and the oxide layer to create in the interface a spatial variation of a nitrogen concentration that decreases in distance from the nitrogen-doped SiC epitaxial layer below the interface to the oxide layer above the interface.

2. The method as in claim 1, wherein the insulator material includes silicon oxide.

3. The method as in claim 1, wherein the oxide layer is grown at a high temperature within a range 900° C. to 1200° C. in an oxidizing environment.

4. The method as in claim 1, wherein the nitrogen doped SiC epitaxial layer has a thickness less than 500 nm.

5. The method as in claim 1, wherein the nitrogen doped SiC material has a carrier concentration greater than $1 \times 10^{18}$ cm$^{-3}$.

6. The method as in claim 1, further comprising forming one or more transistor structures over the insulator material of the oxide layer.

7. The method as in claim 1, wherein the SiC epitaxial layer includes an n-type SiC epitaxial layer.

8. The method as in claim 1, wherein the nitrogen doped SiC epitaxial layer includes a nitrogen doped n-type SiC epitaxial layer.

9. A method for forming a transistor over a SiC substrate, comprising:
    forming a SiC epitaxial layer over a SiC substrate;
    forming a source region and a gate region over the SiC epitaxial layer;
    forming a thin epitaxial layer of a nitrogen doped SiC material on over the gate region over the SiC epitaxial layer;
    growing an oxide layer to form an insulator material on the nitrogen doped SiC epitaxial layer to form an interface that includes nitrogen between the nitrogen doped SiC epitaxial layer and the oxide layer without performing post oxidation gas annealing to create in the interface a spatial variation of a nitrogen concentration that decreases in distance from the nitrogen-doped SiC epitaxial layer below the interface to the oxide layer above the interface; and
    forming a source conductive contact over the source region and a gate conductive contact over the gate region as part of a transistor.

10. The method of claim 9, wherein the SiC epitaxial layer includes an n-type SiC epitaxial layer.

11. The method of claim 9, wherein the nitrogen doped SiC material includes a nitrogen doped n-type SiC material.

12. A method for fabricating a silicon carbide (SiC) device, comprising:
    forming a thin epitaxial layer of a nitrogen doped SiC material on a SiC epitaxial layer formed on a SiC substrate;
    thermally growing an oxide layer to form an insulator material on the nitrogen doped SiC epitaxial layer; and
    controlling the thermally growing the oxide layer to cause the nitrogen doped SiC epitaxial layer in the oxide layer to be at least partially consumed to produce an interface including nitrogen between the nitrogen doped SiC epitaxial layer and the oxide layer so that the interface has a spatial variation of a nitrogen concentration that decreases in distance from the nitrogen-doped SiC epitaxial layer below the interface to the oxide layer above the interface.

13. The method as in claim 12, wherein the insulator material includes silicon oxide and wherein the oxide layer is grown at a high temperature within a range 900° C. to 1200° C. in an oxidizing environment.

14. The method as in claim 12, wherein the nitrogen doped SiC epitaxial layer has a thickness less than 500 nm.

15. The method as in claim 12, further comprising forming one or more transistor structures over the insulator material of the oxide layer.

16. The method of claim 12, wherein the SiC epitaxial layer includes an n-type SiC epitaxial layer.

17. The method of claim 12, wherein the nitrogen doped SiC material includes a nitrogen doped n-type SiC material.

* * * * *